United States Patent [19]

Knepprath

[11] Patent Number: 5,223,452
[45] Date of Patent: Jun. 29, 1993

[54] METHOD AND APPARATUS FOR DOPING SILICON SPHERES

[76] Inventor: Vernon E. Knepprath, 4904 W. Park Ave., Sherman, Tex.

[21] Appl. No.: 784,614

[22] Filed: Oct. 29, 1991

Related U.S. Application Data

[63] Continuation of Ser. No. 454,326, Dec. 21, 1989, abandoned.

[51] Int. Cl.⁵ .......................................... H01L 21/223
[52] U.S. Cl. ..................................... 437/165; 437/160; 437/168; 437/169
[58] Field of Search ............... 437/165, 168, 169, 160; 156/620.4

[56] References Cited

U.S. PATENT DOCUMENTS

| | | | |
|---|---|---|---|
| 3,986,905 | 10/1976 | Garavaglia | 437/954 |
| 3,998,659 | 12/1976 | Wakefield | 437/169 |
| 4,661,177 | 4/1987 | Powell | 437/160 |
| 4,789,596 | 12/1988 | Allen et al. | 156/620.4 |

FOREIGN PATENT DOCUMENTS

| | | | |
|---|---|---|---|
| 0154268 | 12/1979 | Japan | 437/168 |
| 0020510 | 2/1985 | Japan | 437/168 |
| 0196816 | 8/1989 | Japan | 437/168 |

Primary Examiner—Brian E. Hearn
Assistant Examiner—Trung Dang
Attorney, Agent, or Firm—Richter Darryl Burke; James C. Kesterson; Richard L. Donaldson

[57] ABSTRACT

A method and apparatus for doping silicon spheres (48) with a solid phosphorous source (41, 42) is disclosed. Two solid sheets (41, 42) of solid phosphorous source are held in a chamber (32) and aligned substantially parallel to one another for holding the plurality of silicon spheres therebetween. The chamber (32) temperature is increased to vaporize the sheets (41 and 42) to evenly diffuse phosphorous vapor into the silicon spheres (48).

13 Claims, 2 Drawing Sheets

METHOD AND APPARATUS FOR DOPING SILICON SPHERES

This application is a continuation of application Ser. No. 454,326, filed Dec. 12, 1989, now abandoned.

TECHNICAL FIELD OF THE INVENTION

This invention relates generally to a method and apparatus for doping silicon spheres, and more particularly to a method and apparatus for doping silicon spheres for use in solar arrays.

BACKGROUND OF THE INVENTION

A system that has proven useful for efficiently producing electricity from the sun's radiation is described in U.S. Pat. No. 4,691,076, which is assigned to the present assignee. In that system, an array is formed of semiconductor spheres, each sphere having a P-type interior and an N-type skin. The plurality of silicon spheres are housed in a pair of aluminum foil members which form the contacts to the P-type and N-type regions. Multiple arrays are interconnected to form a module of solar cell elements for converting sunlight into electricity.

In order to produce efficient quantities of arrays, it is desireable to have a process which is uncomplicated, efficient and cost effective. A key process step in making the solar arrays which has created difficulties is the introduction of controlled quantities of dopant impurity atoms into the silicon spheres of the solar arrays.

In one previously developed method of introducing a phosphorous dopant into the silicon spheres, the dopant is delivered to the surface of the spheres in a vapor-phase at the proper concentration. While this method works relatively well for doping planar silicon surfaces, it tends to be ineffective when applied to spherical bodies, such as those silicon spheres used for solar cells. For example, it is difficult to obtain uniform diffusion depth within the silicon spheres where two spheres have a point-to-point contact. At these point-to-point contacts, the spheres are shielded from the dopant vapor which results in a nondiffused area and causes electrical shorts in the spheres. Consequently, the entire sphere surface must be doped. Additionally, electrostatic problems can result in the vapor-phase to cause silicon spheres to cluster together which causes nonuniform diffusion.

Some experimentation has been performed in the application of a liquid dopant source such as a liquid phosphorous. Generally, this method has been referred to as a spin-on phosphorous dopant which uses a liquid to attempt to evenly coat the silicon sphere. Unfortunately, when using a liquid dopant, it has been very difficult to apply a uniform coating due to the point-to-point contact between the silicon spheres. It has been found that if the liquid is too thin, the silicon spheres tend to form pinholes along its surface. Conversely, if the liquid dopant is too thick, the dopant film on the silicon spheres tends to crack.

Therefore, there is a need for a method which evenly dopes a silicon sphere to create a uniform diffusion along the entire surface of the silicon sphere. Additionally, a need has arisen for a method of doping which will eliminate prior problems associated with the point-to-point contact of silicon spheres. There is also a need for a method which will reduce the number of processing steps associated with phosphorous doping of silicon spheres. Finally, a need exists for a method of doping a plurality of silicon spheres used in solar cells which is cost effective.

SUMMARY OF THE INVENTION

In accordance with the present invention, a method and apparatus are provided for doping silicon spheres with a solid phosphorous source for a solar cell. The apparatus of the present invention generally comprises a quartz chamber having a furnace attached to its circumference. The silicon spheres are held between two sheets of solid phosphorous source such that the sheets are substantially parallel. These sheets are separated by a resistivity pilot to keep the silicon spheres from touching the top phosphorous sheet. In order to produce a uniform diffusion within the silicon spheres, the chamber interior temperature is increased to approximately 950 degrees Centigrade (°C.) for approximately 30 minutes. This heating causes the solid phosphorous source sheets to vaporize and evenly diffuse into the silicon spheres.

In an alternative embodiment, the apparatus of the present invention comprises a quartz boat held in the chamber for receiving the plurality of silicon spheres. A plurality of substantially spherical pieces of solid phosphorous source are randomly distributed on the boat with the silicon spheres such that there is an even distribution of the spheres and the pieces. Once there has been an even distribution, the chamber is heated to approximately 950° C. with a furnace to vaporize the pieces of solid phosphorous source, such that the vapor diffuses into the silicon spheres.

Another alternative embodiment of the present invention comprises a quartz boat having a even layer of phosphorous source deposited thereon. When the temperature of the chamber is increased to approximately 950° C., the phosphorous source layer vaporizes and diffuses into the silicon spheres.

The present invention presents several technical advantages over conventional processes used for doping silicon spheres with a phosphorous dopant. The present invention features a solid phosphorous source used for doping silicon spheres which is less cumbersome than prior art. When vaporized, the solid phosphorous source evenly diffuses into the silicon spheres. This even distribution of the vapor allows for diffusion despite the point-to-point contact of silicon spheres. The present invention is capable of adequately doping silicon spheres with a phosphorous dopant, while reducing the number of processing steps and expense associated with the prior art.

BRIEF DESCRIPTION OF THE DRAWINGS

Other aspects of the invention and their advantages will be discerned after studying the Detailed Description in conjunction with the Drawings in which.

DETAILED DESCRIPTION OF THE INVENTION

Figure 1:
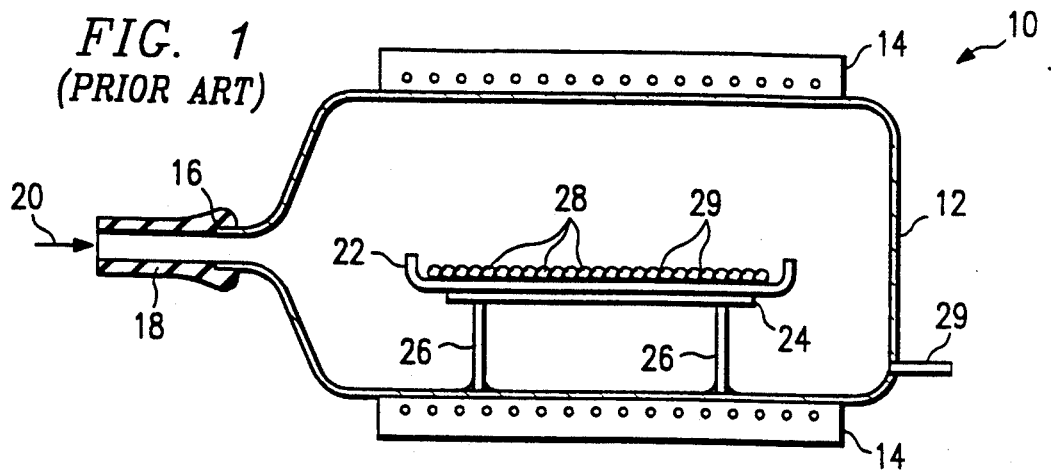
FIG. 1 is a cross-sectional view of an apparatus as used in prior art for diffusing a phosphorous gas into a plurality of silicon spheres.

Referring initially to FIG. 1, a cross-sectional view of an apparatus as used in prior art can be seen. Specifically, an apparatus generally designated 10 can be seen which comprises a chamber 12 having a furnace 14 contained thereon for heating chamber 12 during processing. Chamber 12 has an inlet port 16 at one end for connecting to an inlet line 18.

Inlet line 18 is used for allowing a gas source 20 to enter therethrough. Contained within chamber 12 is a boat 22 which can be held in place by a base 24 which is connected to legs 26. A plurality of silicon spheres 28 are evenly distributed along boat 22 for subsequent doping of silicon spheres 28. In accordance with the prior art, gas source 20, which is preferably a mixture of phosphorous vapor and an oxygen gas, is brought through inlet line 18 into the interior of chamber 12. Unfortunately, the diffusion of gas source 20 is not evenly dispersed to silicon spheres 28 because of a plurality of point-to-point contacts 29 between spheres 28. An outlet line 29 is provided for exhausting gas.

Figure 2:
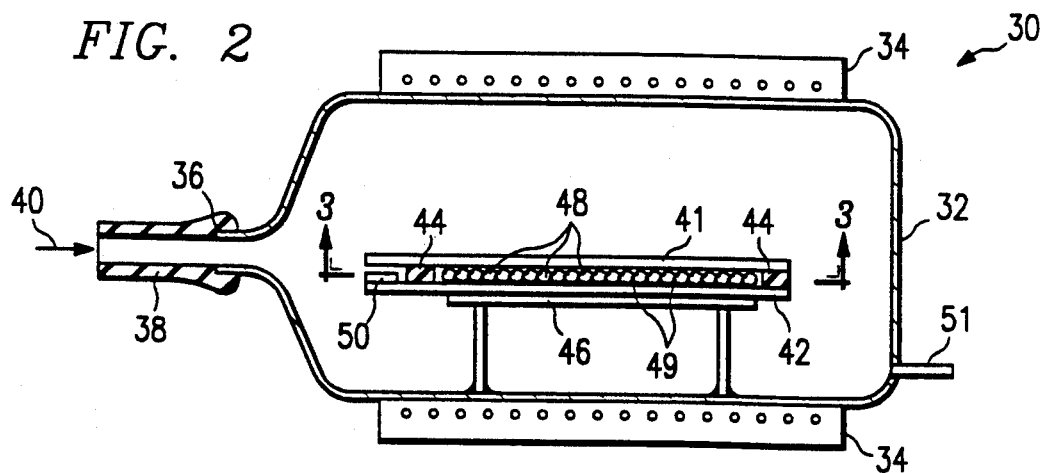
FIG. 2 is a cross-sectional view of the apparatus in accordance with the present invention, illustrating a plurality of silicon spheres held between two sheets of solid phosphorous source.

Referring now to FIG. 2, the preferred embodiment of the present invention can be seen. An apparatus which is generally designated 30 is shown having a chamber 32 with a furnace 34 attached to its circumference. Chamber 32 is preferably made of a quartz material. Chamber 32 has an inlet port 36 at one end for connecting to an inlet line 38. Inlet line 38 is used for allowing a gas source 40 to enter therethrough. The interior of chamber 32 contains two sheets of solid phosphorous sources 41 and 42. Top sheet 41 and bottom sheet 42 are substantially parallel such that a plurality of silicon spheres 48 are held therebetween. In order to keep top sheet 41 from contacting silicon spheres 48, a plurality of resistivity pilots 44 are held between sheets 41 and 42. Sheets 41 and 42, spheres 48, and pilots 44 are held within chamber 32 by a base 46.

In operation, the temperature of chamber 32 is increased by applying energy to furnace 34. Additionally, gas source 40 is injected into inlet line 38 and circulated through chamber 32. Gas source 40 is preferably an inert gas, such as nitrogen, used to prevent back flow of contaminants into chamber 12. Once the temperature of chamber 32 is increased to approximately 950° C., solid source phosphorous sheets 41 and 42 vaporize to create a cloud of phosphorous vapor within chamber 32. The specific reaction is illustrated by:

$$SiP_3O_7 \rightarrow SiO_2 + P_2O_5$$

As can be appreciated, this reaction is accelerated by increasing the temperature of chamber 32. Once the vaporization of phosphorus sheets 41 and 42 has occurred, the vapor will evenly diffuse into silicon spheres 48. Because the vapor comes from two sides of silicon spheres 48, the diffusion within silicon spheres 48 is uniform at point-to-point contacts 49. An outlet line 51 is provided for exhausting a gas.

Figure 3:
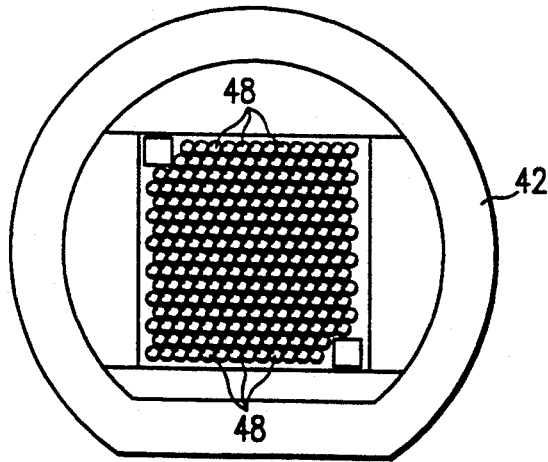
FIG. 3 is a top view of the apparatus as seen along lines 3—3 in FIG. 2.

FIG. 3 illustrates a top view of apparatus 30 as seen along the line 3—3 of FIG. 2. Phosphorus sheet 42 has a plurality of separators 50 held thereon. Separators 50 function to position silicon spheres 48 on sheet 42. Resistivity pilots 44 are disposed at opposing corners of sheets 41 and 42, and are used for insuring that portions of spheres 48 are not in contact with phosphorous source sheet 41.

Figure 4:
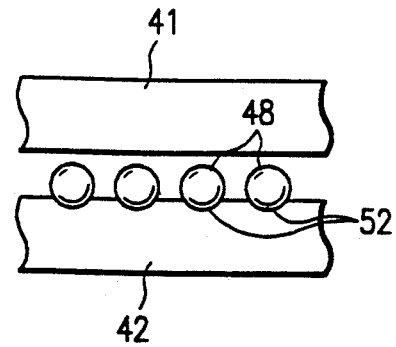
FIG. 4 is a cross-sectional view of the apparatus as shown in FIG. 2, illustrating an alternative method of holding the plurality of silicon spheres onto the sheet of solid phosphorous source.

Referring now to FIG. 4, an alternative embodiment of the invention can be seen. Specifically, sheet 42 has a plurality of grooves 52 formed therein for holding silicon spheres 48. When sheet 42 is vaporized, there is a higher probability that there will be even diffusion into spheres 48 because of the separation between spheres 48. This embodiment insures elimination of point-to-point contacts 49 between silicon spheres 48 as illustrated in FIG. 2.

Figure 5:
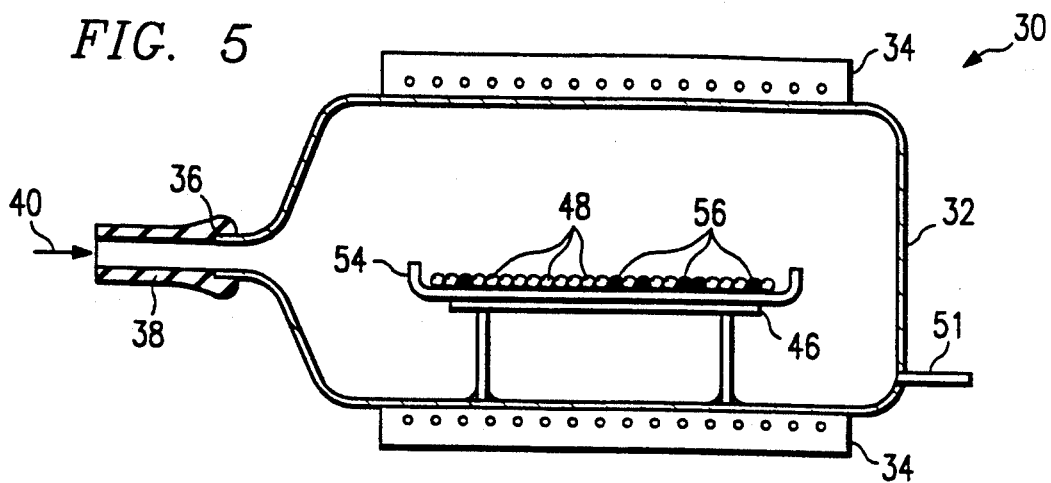
FIG. 5 is a cross-sectional view of an alternative apparatus used for doping silicon spheres having a plurality of substantially spherical phosphorous sources evenly distributed with the plurality of silicon spheres.

Referring to FIG. 5, an alterntive embodiment of the present invention can be seen. FIG. 5 is similar to the embodiment of FIG. 2 with the exception of a boat 54 which is held on base 46. The plurality of silicon spheres 48 are held within boat 54, which prreferably comprises a quartz material. Also held within boat 54 are a plurality of substantially spherical solid phosphorous source pieces 56 which are distributed throughout boat 54 such that there is contact between pieces 56 and spheres 48. In operation, when the interior of chamber 32 is increased to approximately 950° C., pieces 56 vaporize and diffuse within silicon shperes 48. Because of the even distribution of pieces 56, this embodiment is capable of insuring a reduction in point-to-point contacts between silicon spheres 48.

Figure 6:
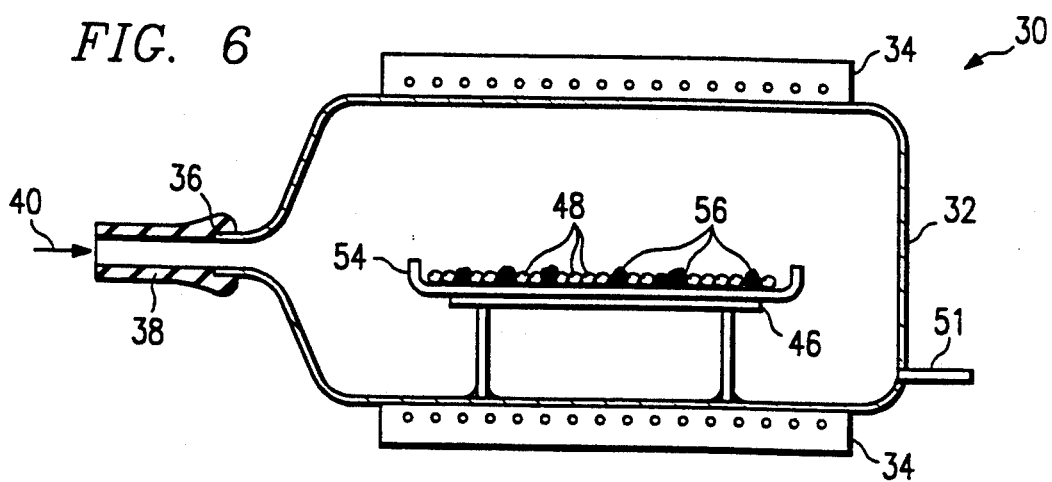
FIG. 6 is a cross-sectional view of another alternative apparatus used for doping silicon spheres having a plurality of phosphorous chunks evenly distributed with the plurality of silicon spheres.

Referring now to FIG. 6, another alternative embodiment of the present invention can be seen. FIG. 6 illustrates an embodiment similar to that of FIG. 5. Specifically, a plurality of phosphorous source chunks 56 are evenly distributed throughout boat 54 such that there is contact between chunks 56 and silicon spheres 48. This alternative embodiment has the advantage of containing larger solid phosphorous source chunks 56 which are easily handled during operation by the user.

Figure 7:
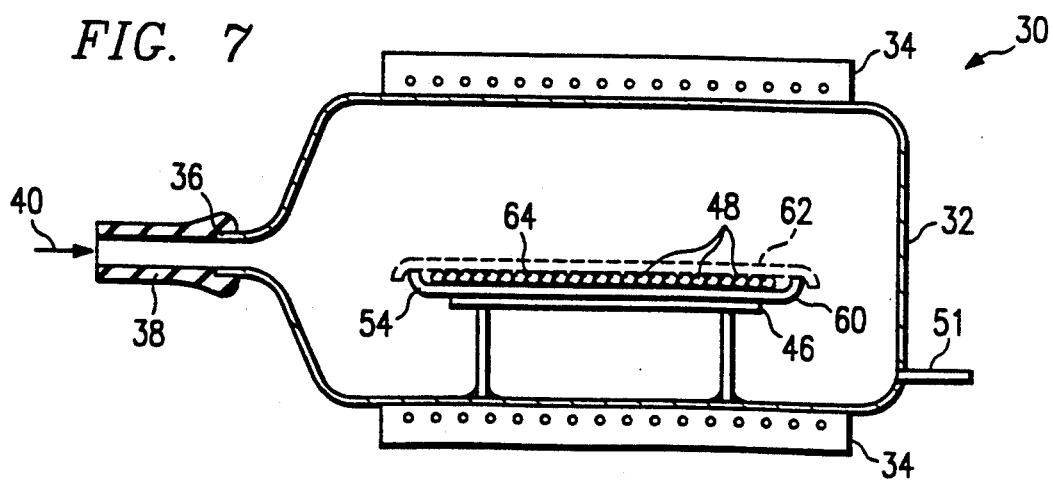
FIG. 7 is a cross-sectional view of another alternative embodiment having a boat lined with a phosphorous source layer for doping the silicon spheres held therein.

Referring now to FIG. 7, another alternative embodiment of the present invention can be seen. Specifically, boat 54 has a phosphorous source layer 60 evenly deposited thereover the upper surface thereof. When the temperature of the chamber 32 increases to approximately 950° C., phosphorous source layer 60 will vaporize and diffuse into silicon spheres 48. This alternative embodiment is equipped with a top 62 which can be optionally used. Top 62 preferably has a thin layer of solid phosphorous source evenly coated thereon to enhance the extent of diffusion within silicon spheres 48. This particular embodiment is able to capture the vapor within a region 64 which is created between top 62 and boat 54. Boat 54 and top 62 can be made of a quartz material. Additionally, boat 54 and top 62 can be relayered with a phosphorous source for allowing them to be recycled and reused for doping silicon spheres 48.

The present invention can be illustrated by reference to the examples below:

EXAMPLE 1

The preferred embodiment, which features two sheets of a solid phosphorous source having silicon spheres contained therein, was tested. The sheets were manufactured by SOHIO Engineered Materials Company and are commercial known as PDS Phosphorous PH-950 N-type planar diffusion sources. When a diffusion temperature of approximately 950° C. was applied for approximately 30 minutes to the active component (PH-950), SiP$_3$O$_7$ decomposed to form the desired dopant series, P$_2$O$_5$ vapor. The silicon spheres had a diameter of approximately 20 mils.

The silicon spheres were assembled to form arrays used in a solar cell and the solar cell was tested for its integrity. The test revealed that the open circuit voltage was approximately 548 millivolts. The short circuit current of the solar cell was approximately 1.3 miliamps. The fill factor associated with the solar cell had a 72.3% effectiveness. The overall cell efficiency was approximately 6.2% which proved to be very beneficial for utilization as a solar cell in the industry. Each silicon sphere of the solar arrays was tested for its integrity to determine if adequate phosphorous diffusion had been performed on all spheres. It was determined that each of the 37 spheres had acceptable integrity for use in a solar cell. It was also determined that the concentration of the carrier was approximately $1.0 \times 10^{17}$ atoms per centimeter cubed (atoms/cc$^3$) at a depth within each sphere between approximately 0.5 microns to approximately 2.0 microns. Surface concentration of the silicon sphere is $3.0 \times 10^{20}$ atoms/cc$^3$.

EXAMPLE 2

A test was performed utilizing a plurality of substantially spherical phosphorous pieces evenly distributed throughout the silicon spheres. The silicon spheres had an average diameter of 20 mils. These pieces of phosphorous had an approximate diameter of 10 microns. Once the furnace was increased to 950° C. for approximately 30 minutes, the diffusion proved to be successful throughout all silicon spheres. The solar cell produced from the silicon spheres was tested and the open circuit voltage was approximately 560 millivolts and the short circuit current was approximately 1.68 miliamps. The fill factor efficiency was approximately 68.2%. The overall solar cell efficiency was 8.6%. The concentration of phosphorous was approximately $1.0 \times 10^{17}$ atoms/cc at a depth within each sphere between approximately 0.5 microns to approximately 2.0 microns. Surface concentration of the silicon sphere is $3.0 \times 10^{20}$ atoms/cc$^3$.

EXAMPLE 3

A test was conducted using a boat for holding the silicon spheres having a phosphorous layer deposited thereon with a top for holding the vapor between the region formed therebetween. The silicon spheres had an average diameter of 20 mils. The temperature of the furnace was increased to approximately 950° C. and held for approximately hour. The open circuit voltage of the solar cell produced from these silicon spheres was 562 miliamps and the short circuit current was approximately 1.7 miliamps. The fill factor for the solar cell was approximately 6.9%, while the overall cell efficiency was 8.7%. The concentration of phosphorous was approximately $1.0 \times 10^{17}$ atoms/cc at a depth within each sphere between approximately 0.5 microns to approximately 2.0 microns. Surface concentration of the silicon sphere is $3.0 \times 10^{20}$ atoms/cc$^3$.

In summary, an advantageous method for doping silicon spheres has been disclosed which features the use of a solid phosphorous source held within a chamber. This phosphorous source is vaporized by increasing the furnace temperature to evenly diffuse into the silicon spheres. This method of doping has been useful for doping silicon spheres used in solar cells. The diffusion has proven to be uniform throughout the entire sphere to avoid the prior problems associated with point-to-point contacts between the spheres.

While the preferred embodiments of the invention and their advantages have been disclosed in the above-detailed Description, the invention is not limited thereto, but only by the spirit and scope of the appended claims.

What is claimed is:

1. A method for doping a plurality of silicon spheres with a dopant, which comprises the steps of:
    positioning said plurality of silicon spheres in a chamber;
    utilizing a solid dopant source to provide a contact and support area for said silicon spheres; and
    vaporizing dopant from said solid dopant source to create a dopant cloud, simultaneously diffusing dopant directly from said solid dopant source through said support area and from said dopant cloud into said silicon spheres causing substantially even diffusion of phosphorus into said silicon spheres.

2. The method as recited in claim 1, wherein dopant comprises solid phosphorous source.

3. The method as recited in claim 2, wherein said step of vaporizing comprises the step of heating said chamber to induce vaporization of said solid phosphorous source.

4. The method as recited in claim 3, wherein said heating step increases said chamber temperature to approximately 950° C. for approximately 30 minutes.

5. The method as recited in claim 1, further comprising the steps of
    aligning two solid phosphorous sheet sources apart from one another for holding the silicon spheres therebetween; and
    vaporizing dopant from said two solid phosphorous sheet sources to create a dopant cloud, simultaneously diffusing dopant directly from said two solid phosphorous sources through said support area and from said dopant cloud into said silicon spheres causing substantially even diffusion of phosphorous into said silicon spheres.

6. The method as recited in claim 1, further comprising a step of evenly distributing a plurality of substantially spherical phosphorous source pieces with the silicon spheres.

7. The method as recited in claim 1, further comprising a step of inserting a boat having a phosphorus source layer deposited thereon into said chamber for holding the silicon spheres.

8. The method as recited in claim 7, further comprising a step of inserting a top having a phosphorus source layer deposited thereon, whereby said top is placed over said silicon spheres to enhance diffusion within said spheres.

9. The method as recited in claim 8, wherein said top contacts said silicon spheres.

10. The method as recited in claim 1, wherein said silicon spheres are not in contact with one another.

11. The method as recited in claim 1, wherein said silicon spheres form a single layer.

12. The method as recited in claim 1, wherein said solid dopant source is in particulate form.

13. The method as recited in claim 1, wherein said silicon spheres and said solid dopant source are intimately mixed.

* * * * *